Dec. 23, 1969 G. P. IRVINE 3,485,688
METHOD FOR PRINTING CIRCUIT DESIGNS
Filed March 23, 1966

INVENTOR
GERALD P. IRVINE
BY David N. Koffsky
ATTORNEY

United States Patent Office 3,485,688

Patented Dec. 23, 1969

3,485,688

METHOD FOR PRINTING CIRCUIT DESIGNS

Gerald P. Irvine, Essex Junction, Vt., assignor to International Business Machines Corporation, Armonk, N.Y., a corporation of New York Filed Mar. 23, 1966, Ser. No. 536,700

Int. Cl. C23f *1/02*

U.S. Cl. 156—11 10 Claims

ABSTRACT OF THE DISCLOSURE

A circuit design is produced on a substrate by depositing material capable of spreading and coalescing, such as ink, in two predetermined initially discontinuous and different patterns forming the design, then allowing the material to spread and coalesce together to form a pinhole-free layer of relatively uniform thickness in the design. This process allows very rapid rotogravure printing to be used for printing circuit designs.

This invention relates to the manufacture of printed circuits and more particularly to a method for printing the circuit patterns.

Increasingly difficult specifications for printed circuits are becoming the norm rather than the exception, with extremely thin line widths and thicknesses, sharp edge definitions and the fine tolerances within which these values may vary, being exemplary. While these specifications can be met in the laboratory, the high output production line presents an entirely different situation.

One of the most popular printed circuit production methods involves the deposition of an etch resistant material upon a conductive laminate, with the etch-resistant material either being deposited in the circuit pattern through a silk screen or as an overall covering of the laminate in preparation for a further sensitization step via photographic techniques. Both of these processes are slow and have difficulties associated therewith. Photographic exposure adds extra steps to the process. The leading silk screen techniques require that the screen be heated which sometimes distorts the circuit pattern. Furthermore, in forcing the etch resistant material through the heated screen and onto the conductor surface, the desired result is for the material to coalesce and form into a continuous pattern. Sometimes, this does not occur with the subsequent conductor etching step resulting in open circuits in the etched conductor pattern.

One of the earliest methods for applying etch resistant materials to conductive laminates was via the utilization of well known printing techniques e.g. a letter press-type printing machine was used to impress etch resistant inks upon conductive laminates. The use of direct printing methods has fallen off in recent years for a number of reasons. To lay down a solid line print of etch resistant ink requires the use of a substantial amount of ink to prevent pin holes from occurring. Where relatively large line widths and spacings are involved, this technique is satisfactory, but in more advanced and miniaturized printed circuits, the excessive amount of ink required with a single printing causes runs and smearing. A second overprinting has been utilized to overcome this problem, but only with standard solid line type printing apparatus e.g. letter-press. This is obviously slow and inadequate for high production quantities. Nevertheless, some printing techniques offer considerable speed improvements over any other type of printed circuit process now known e.g. a rotogravure press processes hundreds of feet of printed matter per minute.

Accordingly, it is an object of this invention to provide an improved printed circuit manufacturing process.

It is another object of this invention to provide an improved printed circuit manufacturing process which is continuous in nature and provides a high output of circuits.

It is still another object of this invention to provide a printed circuit production method which makes use of high speed printing processes.

And yet another object of this invention is to provide a printing process for producing printed circuits whereby closely spaced extremely fine conductive lines may be produced.

In accordance with the above stated objects, it has been found that the gravure technique of printing may be applied to the production of printed circuits. In its broadest aspects, the invention contemplates the deposition of a material in a circuit design upon a substrate with a first gravure pattern and a subsequent overlaying deposition of the material in the same design utilizing a different gravure pattern. In a preferred embodiment of the invention, an initial thin anchor coat of etch resistant ink is laid down in the desired circuit pattern upon a conductive substrate. A slightly narrower second coat of etch resistant ink is then laid down in a different gravure pattern directly over the first anchor coat. The anchor coat acts to prevent the second coat from running or smearing and additionally provides the desired fine edge definition for the conductive lines, while the secondary coat provides the desired line thickness of etch resistant ink. Through this technique, the high speed printing characteristics of continuous rotogravure machinery may be utilized to provide printed circuits.

The foregoing and other objects, features and advantages of the invention will be apparent from the following more particular description of the preferred embodiment of the invention, as illustrated in the accompanying drawings.

One of the fastest and most effective printing techniques is known in the art as the "gravure" process. This process entails the use of an etched printing surface wherein tiny cups or wells have been formed which are filled with ink. Where a darker picture is to be printed, the wells are deep and hold a relatively large amount of ink whereas the lighter portions of the picture are formed by having relatively shallow wells which hold a correspondingly smaller amount of ink. The quality of the final print may vary from widely spaced dots indicating a rather lightly shaded portion to very closely spaced dots to indicate a very dark area. Because of the amount of ink applied, the dots on the darker portions frequently spread and overlap one another giving the effect of non-screened continuous tone. Nevertheless, this process has not been applied to the printing of acid resistance inks upon conductive substrates for the reason that acid etching fluids tend to penetrate certain areas where the ink has not spread and overlapped to provide a continuous tone. Even when the initial print of resist ink is overprinted using the same gravure pattern, acid penetration has been observed.

Figure 1:
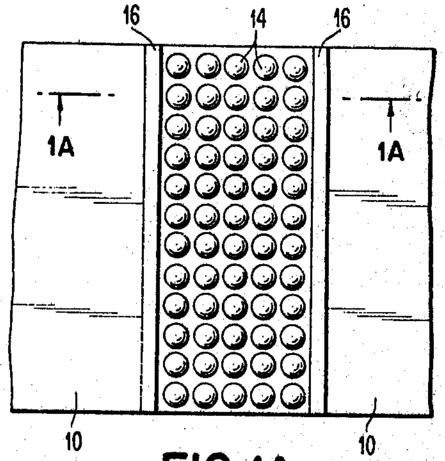
FIG. 1 is a plan view of the anchor coat of etch resistant ink immediately after it has been laid down upon a conductive substrate.
Figure 1A:
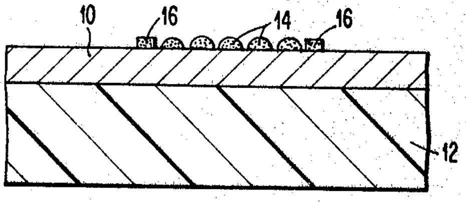
FIG.1A is a view taken along line 1A—1A in FIG. 1.

It has been found that the above described limitations of the gravure process can be overcome by a secondary overprinting of the resist ink with a gravure pattern *different* from the first pattern. Different, in this context is meant in its broadest sense, that is, the secondary overprint may be made with dots larger in size or smaller in size or of the same size but using a pattern which is positionally offset from the initial pattern. In this manner, it has been found that all voids in the initial ink coat are covered and a relatively constant thickness of ink throughout the entire line width is provided. In FIGS. 1 and 1A, a layer of conductor 10 is supported by a nonconductive substrate 12. Such a laminated structure is available commercially with the constituent components 10 and 12 comprising any of a number of materials. For instance, conductor material 10 can be copper and nonconductive substrate 12 a very thin sheet of polyethylene terephthalate. Such materials come in large rolls (much the same as paper rolls) and can be handled in a like manner.

Assuming that it is desired to print a simple conductive line on the laminate utilizing a rotogravure printing press, the laminate will be passed beneath the rolls and will have deposited thereon a pattern of ink dots 14 such as shown in FIG. 1 (highly magnified). Ink dots 14 are shown immediately after they have been deposited and before any spreading has occurred. Bounding the edges of ink dots 14, are a pair of edge defining lines 16. While these are not absolutely necessary, they assist in maintaining the width of the conductive line within critical tolerance values. The ink used in this printing process may be any one of a number of well known acid resist inks which are impervious to acid etching solutions. Such an ink is Spirito Resist Ink, No. 28715 marketed by Gotham Ink Co., Long Island City, N.Y.

Figure 2:
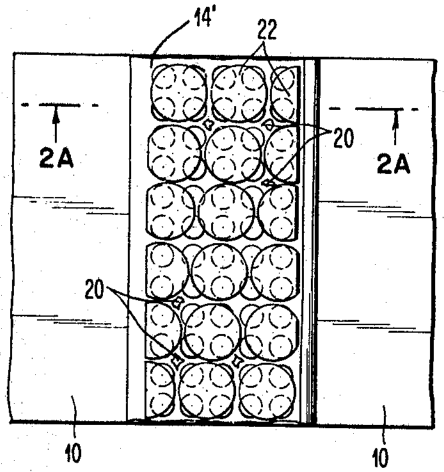
FIG. 2 is a plan view of the second coat of etch resistant ink just after it has been laid down upon the anchor coat.
Figure 2A:
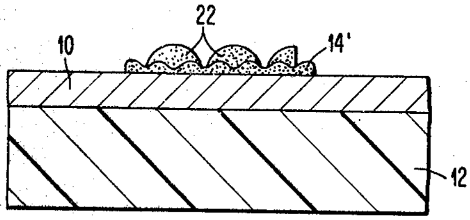
FIG. 2A is a view taken along line 2A—2A in FIG. 2.
Figure 3:
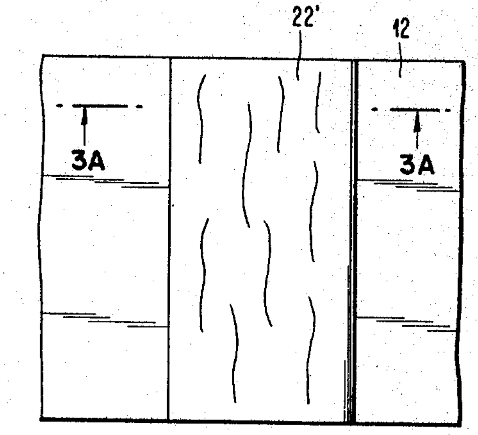
FIG. 3 is a plan view of the circuit line after both coats of ink have dried and the underlying conductive substrate has been etched to provide a desired circuit configuration.
Figure 3A:
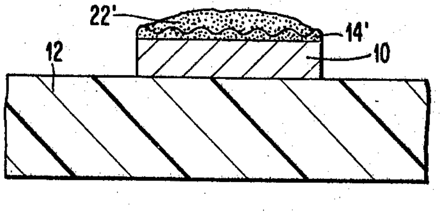
FIG. 3A is a view taken along line 3A—3A in FIG. 3.

Immediately after the ink dots are deposited upon conductor 10, they commence spreading and coalescing to form a nearly continuous coating 14' (FIG. 2A). However, due to the fact that runs and smears cannot be tolerated, the amount of ink laid down in the initial printing step cannot be so thick as to assure a completely continuous coating. As a result, voids 20 occur which expose the underlying conductor metal 10. In addition, the thickness of etch resistant ink between the dot positions is insufficient to withstand erosive affect of the acid etching fluids. It has been found that reprinting over the initial line print with an additional layer of ink using same gravure pattern will generally not cause the voids to be filled and the ink thickness between dots to be materially increased. When, however, a different gravure pattern having a line width which is somewhat less than the original pattern is overprinted on the original line print, it has been found that all of the voids become filled and a relatively uniform thickness of resist ink is left upon conductor metal 10. Such a second resist print is shown by dots 22 immediately after they have been laid down by the gravure press. The width of the dot pattern 22 is made somewhat less than the original pattern to avoid having the edge definition disturbed in the secondary printing. Immediately after the secondary coat is laid down, it coalesces and spreads to form a coating 22' as shown in FIGS. 3 and 3A. Secondary ink coating 22' fills all of the voids formed during the initial printing of ink coating 14. During a subsequent etching step after the combined ink coating 14' and 22' have been allowed to dry, the conductor line 10 as shown in FIG. 3A is formed while the remaining portions of conductor metal 10 are removed.

While the gravure dot pattern shown in FIG. 2 employs ink dots which are of a large size than the initial gravure pattern, it should be realized that the same or smaller dot pattern could be utilized so long as it is offset from the initial dot pattern.

This invention has been described with reference to an embodiment wherein etch resistant inks are employed. It should also be realized that in its broadest nature, the invention can be employed to lay down conductive ink directly upon nonconductive substrate. The required number of coats of conductive ink may be varied in accordance with the desired resistivity of the circuit lines.

While the invention has been particularly shown and described with reference to a preferred embodiment thereof, it will be understood by those skilled in the art that changes in form and details may be made therein without departing from the spirit and scope of the invention. For instance while only two successive gravure printings have been discussed it should be obvious that if increased thicknesses of the printed material are required, that 3 or more coats of material can be applied utilizing the teahcings of the invention.

I claim:

1. A method for producing a circuit design upon a substrate which comprises the steps of:

depositing a material capable of spreading and coalescing a first initial discontinuous pattern of said design on said substrate to provide an anchor coating; and depositing said material capable of spreading and coalescing in a different initially discontinuous pattern of said design directly over said anchor coat, and allowing said material so deposited to spread and coalesce into a relatively uniform thickness of said material in said circuit design.

2. The invention as defined in claim 1 wherein said first pattern is deposited in a pattern of dots of said material and said different pattern is deposited in a pattern of different sized dots of said material.

3. The invention as defined in claim 1 wherein said deposition steps include depositing circuit lines, the circuit line widths of said first pattern being greater than the line widths defined by said different pattern.

4. The method of claim 1 wherein said material is conductive.

5. The process of claim 1 in which said material is an etch resistant ink and is applied by gravure printing.

6. The method of claim 1 wherein said material is etch resistant.

7. The method of claim 6 wherein said substrate is a laminate of a conductor and a nonconductive support with said circuit design being deposited upon said conductor and further including the step of etching away the areas of conductor not covered by said design.

8. A process for producing a circuit design on a substrate which comprises:

depositing an etch resistant ink in a first predetermined initially discontinuous pattern to form the design, depositing an etch resistant ink to form the design in a second predetermined initially discontinuous pattern positionally offset from the first pattern, and allowing the ink so deposited to spread and coalesce into a relatively uniform thickness in the design.

9. The process of claim 8 in which the design in the second predetermined pattern has a line width somewhat less than the line width of the design in the first pattern.

10. The process of claim 9 in which the ink is applied by rotogravure printing.

References Cited

UNITED STATES PATENTS

| | | | |
|---|---|---|---|
| 2,140,994 | 12/1938 | Gorlich | 117—45 XR |
| 2,776,235 | 1/1957 | Peck. | |
| 2,777,193 | 1/1957 | Albright et al. | |
| 2,861,029 | 11/1958 | Bain et al. | 156—11 XR |
| 3,320,657 | 5/1967 | Strobel | 156—8 XR |

ROBERT F. BURNETT, Primary Examiner

WILLIAM A. POWELL, Assistant Examiner

U.S. Cl. X.R.

117—212, 215, 45 71; 156—18; 161—413; 174—68.5

PO-1050
(5/69)

UNITED STATES PATENT OFFICE
CERTIFICATE OF CORRECTION

Patent No. 3,485,688 Dated December 23, 1969

Inventor(s) Gerald P. Irvine

It is certified that error appears in the above-identified patent and that said Letters Patent are hereby corrected as shown below:

Column 3, Line 43, after "withstand" add -- the --; Column 3, Line 68, change "large" to -- larger --. Column 4, Line 1, after "upon" add -- a --; Column 4, Line 18, after "cing" add -- in --; Column 4, Line 18, change "initial" to -- initially --.

SIGNED AND
SEALED
AUG 4 - 1970

(SEAL)
Attest:

Edward M. Fletcher, Jr.
Attesting Officer

WILLIAM E. SCHUYLER, JR.
Commissioner of Patents